United States Patent [19]

Chiang

[11] 4,297,626

[45] Oct. 27, 1981

[54] METHOD OF DETERMINING OPERATING CURRENTS FOR STEPPING MOTOR

[76] Inventor: David Chiang, 649 Caledonia Rd., Dix Hills, N.Y. 11746

[21] Appl. No.: 119,503

[22] Filed: Feb. 7, 1980

[51] Int. Cl.$^3$ .............................................. G05B 19/40
[52] U.S. Cl. .................................... 318/696; 318/611
[58] Field of Search .............. 318/696, 685, 611, 702

[56] References Cited

U.S. PATENT DOCUMENTS

| | | | |
|---|---|---|---|
| 3,541,418 | 11/1970 | Agin et al. | 318/696 X |
| 3,947,742 | 3/1976 | van Acker | 318/611 |
| 4,215,302 | 7/1980 | Chiang | 318/696 |
| 4,219,767 | 8/1980 | Wimmer | 318/611 X |

*Primary Examiner*—B. Dobeck
*Attorney, Agent, or Firm*—Hane, Roberts, Spiecens & Cohen

[57] ABSTRACT

A stepping motor system is shown wherein a method is employed for determining the optimum amplitude of the current supplied to the stator winding of the motor. A series of different currents are applied to the motor. First, the stator windings are energized with currents of certain base magnitudes. Then the current in one winding is increased by a small amount and the current in the adjacent winding is decreased by a small amount so that the rotor tends to move towards its new equilibrium position. When the rotor reaches its maximum displacement the current changes in the windings are reversed so that not only will the rotor "hunt" for its new equilibrium position but it overshoots with twice the magnitude. This process continues for a certain period of time during which the oscillation magnitudes rapidly grow. In one embodiment, after a maximum amplitude is reached, the current changes are applied out of phase with the oscillations to now try to decrease their amplitude. After another period of time, the current changes are terminated, the residual oscillations are monitored and all oscillations greater than a given amplitude are recorded. As this process can be repeated for different base currents, that current which yields the minimum number of "over" oscillations during the monitoring period is selected as the current amplitude for subsequent use in positioning the rotor. In another embodiment, the damping portions of the method is not performed. Then, the base current is selected which results in the greatest number of "over" oscillations.

10 Claims, 7 Drawing Figures

TUTORIAL STEPPING MOTOR SYSTEM — TSM

STEPPING MOTOR SYSTEM — SMS

CALIBRATE CONTROLLER - CLC

TIMING CIRCUITS — TCK

METHOD OF DETERMINING OPERATING CURRENTS FOR STEPPING MOTOR

BACKGROUND OF THE INVENTION

This invention pertains to resonant systems and more particularly to stepping motor systems which are optimally driven by exploiting the resonant properties between the stator field and the rotor.

In my copending U.S. application Ser. No. 876,656 filed Jan. 6, 1978 and Ser. No. 82,742 filed Oct. 9, 1979 I disclosed new appartus and methods for driving conventional stepping motors. In particular the apparatus and methods relied upon among other things, particular current waveforms with certain amplitudes for energizing the windings of the stator. These amplitudes were derived by exploiting the resonant properties of the system. The disclosure of such apparatus and methods has created a demand for even more versatile devices. In particular, it has been discovered that the load connected to the stepping motors can be changed for certain applications. For example, if the stepping motor is being used in a printer utilizing interchangeable "daisy" wheels for different type fonts, the problem arises in that each wheel may have a different mass. Accordingly, the load on the rotor will change. The changing of this load in effect changes the resonant properties of the system. Accordingly, the original driving current amplitudes will no longer be optimum.

SUMMARY OF THE INVENTION

It is therefore an object of the present invention to provide novel apparatus and means for determining and modifying a resonant parameter of a vibrating system.

It is another object of the invention for providing an improved method for determining the optimum amplitude of currents to be applied to the stator windings of a stepping motor.

According to one aspect of the invention wherein it is desired to find a resonant parameter of a vibrating system, it is contemplated to give in phase excitations to the system for a first predetermined time interval in order to increase the amplitude of the vibrations of the system. Thereafter, the number of vibrations in the system which exceed a given amplitude during a given period of time are counted. This counted number gives an indication of the parameter. For example, if the parameter were the resonant frequency of the system and the periodic excitations were applied at that frequency, the number of vibrations exceeding the given amplitude would effectively be negligible. If however, the excitation period were significantly different from the resonant period then the number of vibrations exceeding the given amplitude during the third determined time interval would be significant. Thus by applying different frequencies for the impulses one could easily determine the resonant frequency of the system. The same technique could be used to sense the mass of the system as well as elastic co-efficients.

In a specific case, the technique is used in a stepping motor to determine the optimum amplitude of the currents fed to the stator windings. As will hereinafter, become apparent these currents are a function of the torque and inertia of the system.

BRIEF DESCRIPTION OF THE DRAWING

Other objects, the features and advantages of the invention will be apparent from the following detailed description when read in connection with the accompanying drawing which shows by way of example and not limitation appartus for realizing the invention. In the drawing.

DESCRIPTION OF THE PREFERRED EMBODIMENT OF THE INVENTION

Before describing the actual operation of the invention, it is desirable to review some theoretical considerations. As described in my application Ser. No. 8,742 it has been shown that optimum movement of the rotor and load occurs when it is subject to constant acceleration. It is known that the acceleration $\alpha = \ddot{\Theta} = \tau/I$; where $\tau =$ torque, and $I =$ moment of inertia. If an open loop motor system were designed for an ideal constant acceleration and the moment of inertia changed because of changing load or the torque changed because of mechanical tolerances (e.g. air gaps) from motor to motor, then the acceleration would deviate from the optimum. Thus the amplitude of the driving current must be changed to obtain the desired acceleration.

It is also known that the torque $\tau$ is monotonically increasing function of the amplitude of the current feed to the stator windings so that by changing the magnitude of this current one can control the torque and therefore the acceleration of the rotor.

Furthermore, in a stepping motor, the rotor when influenced by a step displacement of the stator magnetic field oscillates in almost exactly in the same manner as a pendulum. (See the discussion in my U.S. application Ser. No. 872,656). It can be shown that the resonance period of the oscillations is proportional to $\sqrt{I/\tau}$.

It is also known from resonant frequency theory that if one positively impulses or in phase excites the resonant system periodically at the resonance frequency the amplitude of the oscillations will build up and if one negatively impulses or out-of-phase excites an oscillating resonant system at the resonance frequency the amplitude of the oscillation will rapidly die down. At off-resonance frequencies the oscillations will not die rapidly down. Thus if one excites the system at the nominal resonance frequency through a cycle of in-phase impulses, followed by a series of out-of-phase impulses and then monitors the oscillations one can tell whether a property such as mass, moment of inertia or torque is proper for the resonance frequency. In the case of the stepping motor one can go through the impulse sequences for a set of winding current amplitudes and determine which current amplitude is needed for the system to have the desired resonance frequency and thus the desired optimum acceleration.

Figure 1:
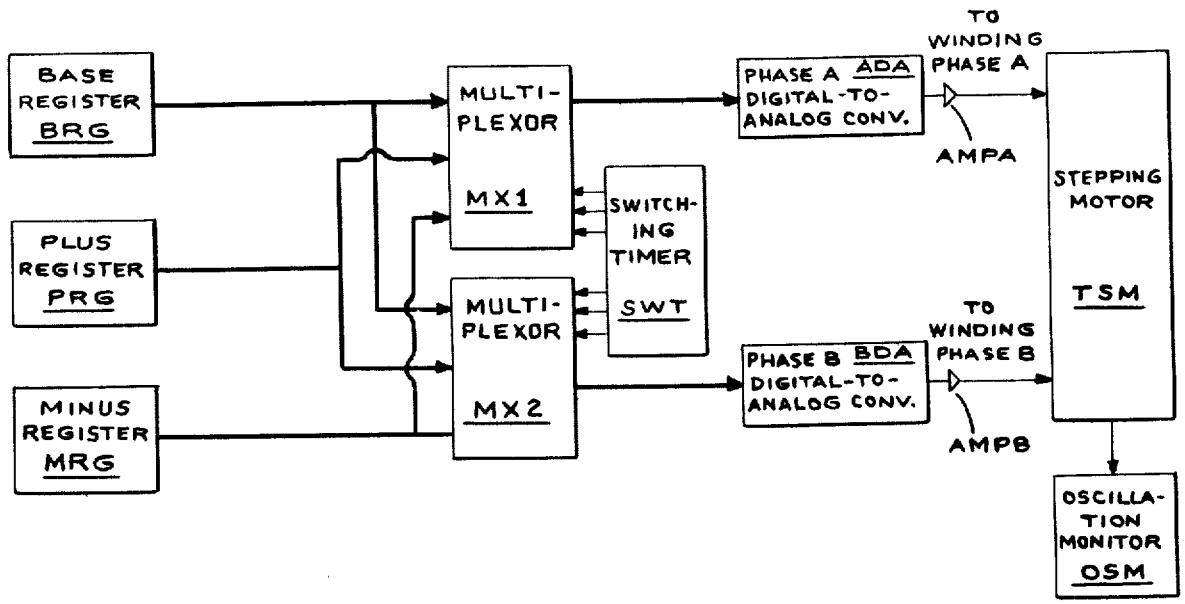
FIG. 1 shows a generalized diagram of a stepping motor system in accordance with the principle of the invention.

Prior to going into the details of the preferred embodiment it will be useful to study the tutorial stepping motor system TSM of FIG. 1. In said system a four phase stepping motor TSM as described in my above-referenced applications will be used. In those applications and as will be described hereinafter there are certain currents used for exciting the windings. For the present it need only be known that for several positions of the stator field, the individual currents through two adjacent phase windings (say phase A and phase B) are equal although moving in opposite directions of amplitude, whereas the current through the two other phase windings (say phase C and phase D) is zero.

Thus one stores three digital representations of current. The first is related the "base" current and is stored in base register BRG having an output connected to a first input of each of the multiplexors MX1 and MX2. This "base" current is the value of the equiamplitude currents mentioned above. The second is related to the "base" current plus an increment and is stored in plus register PRG having an output connected to a second input of each of the multiplexors MX1 and MX2. The third is related to the "base" current minus an increment and is stored in minus register MRG having an output connected to a third input of each of the multiplexors MUX1 and MUX2.

The multiplexors MX1 and MX2 under control of signals from switching timer SWT connects one of their three inputs, respectively, to associated digital-to-analog converter ADA/ABA which generates the desired current amplitudes for feeding via respective current amplifiers AMPA/AMPB to the phase A and phase B windings.

The switching timer SWT controls the multiplexors to operate according to the following table:

system includes a stepping motor SM, which by way of example is of the variable reluctance type as described in the above cited applications. It should be realized however, that the stepping motor could also be of the permanent magnet type. The shaft of the stepping motor is connected to the load LD which is to be driven. This load could be the capstan of a tape drive, the daisy wheel of a printer or any other load which must be rapidly and precisely positioned. The shaft is also coupled to a transducer TD which is used to indicate the angular position of the shaft at a particular fiducial point. The transducer TD includes a slotted disc DSC interposed between the light emitting diode LED and a photodiode PHD. In operation, the photodiode PHD is masked from the light emitting diode except when the slot in the disc DSC is in the line of sight from the light emitting diode to the photo diode. It should be said that the transducer TD can take many other forms, it only being necessary to indicate the fiducial position and emit pulses whenever the disc enters or leaves the fiducial position. The stepping motor can be a four phase stepping motor which is controlled by signals on the lines L1 to L4 from the controlled unit KLU.

In operation, the stepping motor system starts with a calibrate mode to determine the optimum driving current for the windings of the stator of the stepping motor and thereafter switches to the conventional positioning mode.

In the calibrate mode, the system undergoes a plurality of sets of multistep phases. Each set is associated with a particular operating current for the stator windings. In each set there are several phases of operation and in each phase a plurality of steps. During phase one P1 the controlled unit KLU emits a series of positive

| Event | | Output of MX1 | Output of MX2 | Phase A Current | Phase B Current |
|---|---|---|---|---|---|
| Idle | | Output of BRG | Output of BRG | base current | base current |
| Osc. | t1 | Output of PRG | Output of MRG | base current plus | base current minus |
| build | t2 | Output of MRG | Output of PRG | base current minus | base current plus |
| up | t3 | Output of PRG | Output of MRG | base current plus | base current minus |
| | t4 | Output of MRG | Output of PRG | base current minus | base current plus |
| | . | . | . | . | . |
| | . | . | . | . | . |
| | . | . | . | . | . |
| | $t_n$ | Output of PRG | Output of PRG | base current minus | base current plus |
| Osc. | $t_{n+1}$ | Output of MRG | Output of PRG | base current minus | base current plus |
| Attenuation | $t_{n+2}$ | Output of PRG | Output of MRG | base current plus | base current minus |
| | $t_{n+3}$ | Output of MRG | Output of PRG | base current minus | base current plus |
| | $t_{n4}$ | Output of PRG | Output of MRG | base current plus | base current minus |
| | . | . | . | . | . |
| | . | . | . | . | . |
| | . | . | . | . | . |
| | $t_{2n}$ | Output of PRG | Output of MRG | base current plus | base current minus |
| Observation | | Output of BRG | Output of BRG | base current | base current |

Thus, starting from the idle condition, the currents are switched at the desired resonance frequency first to build up the oscillations and then to attenuate the oscillations. Thereafter, the oscillation monitor OSM counts oscillations greater than a given amplitude. In this way by varying the amplitude of the base current one can find the required base current. On the other hand by maintaining the current and varying the switching frequency one could find another resonant property of the system, i.e., the resonance frequency.

While the above explains the principles underlying the invention, there will now be described a working system.

Figure 2:
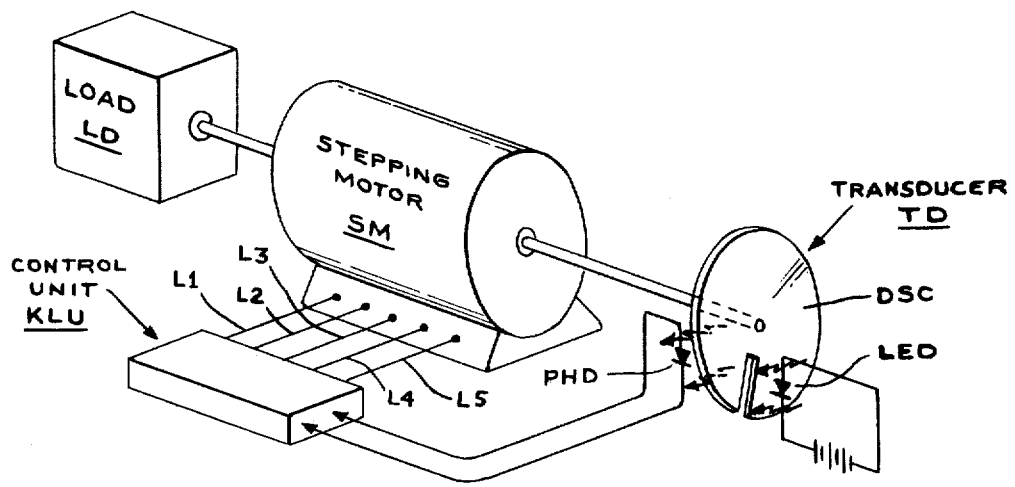
FIG. 2 shows a generalized block diagram of a stepping motor system in accordance with the presently preferred embodiment of the invention.

In FIG. 2 there is shown a stepping motor system SMS which utilizes the invention. In particular, the current impulses on the leads L1 to L4 to the stator windings at the resonance frequency associated with the desired acceleration. During phase two P2 the control unit KLU emits negative impulses of current to the stator windings at the resonance frequency. During the third phase P3 the control unit KLU senses for signals from the photo detector PHD to determine the number of oscillations occurring during this phase. During the fourth phase P4, the control unit KLU runs the housekeeping operations of updating the new current values to be emitted to the stator winding as well as to store information about the number of counted oscillations.

More particularly, with reference to FIG. 2 and FIG. 3 the operation is as follows. At the start of the operation a switch is depressed which causes the stepping motor to automatically step to the point where the slot in the disc DSC is in the line of sight between the lighter emitting diode LED and the photo diode PHD. Thus the shaft is positioned to a home or fiducial position, then phase one begins. During phase one P1, the positive impulses or in-phase excitations as shown on line SP of FIG. 3 caused the motor to oscillate according to the curve RP. By positive impulses or in-phase excitations it is meant that the current changes are so timed with respect to the oscillatory period that they reinforce the oscillations which consequently build up to a maximum at the step S10 of the first phase P1. During phase two the control unit KLU feeds "negative" impulses or out-of-phase excitations to the stepping motor causing the amplitudes of oscillation of the motor about the fudicial position to decrease. By negative impulses or out-of-phase excitations it is meant that each impulse is timed with respect to the nominal oscillation period so as to now damp the amplitude of the oscillations of the motor about the fudicial position.

At the end of phase two P2 the third phase P3 begins. This third phase counts the oscillations whose amplitude exceeds the threshold values PTH and NTH. In one embodiment of the invention this count of this number of threshold values is stored. Then the amplitude of the current to be utilized by the stepping motor is increased during a housekeeping phase four P4. Thereafter, the same series of impulses performed for the new operating current and the count of the oscillations is stored for that current if it is less than the number of oscillations counted for the previous current. Now a third current is selected and the routine is repeated. In fact, the routine is repeated for a plurality of, for example, ten currents. At the end of the routine there will be stored, the current associated with the minimum oscillation count of the third phases P3. Thereafter, the system reverts to the positioning mode using the current associated with the minimum count.

Figure 3:
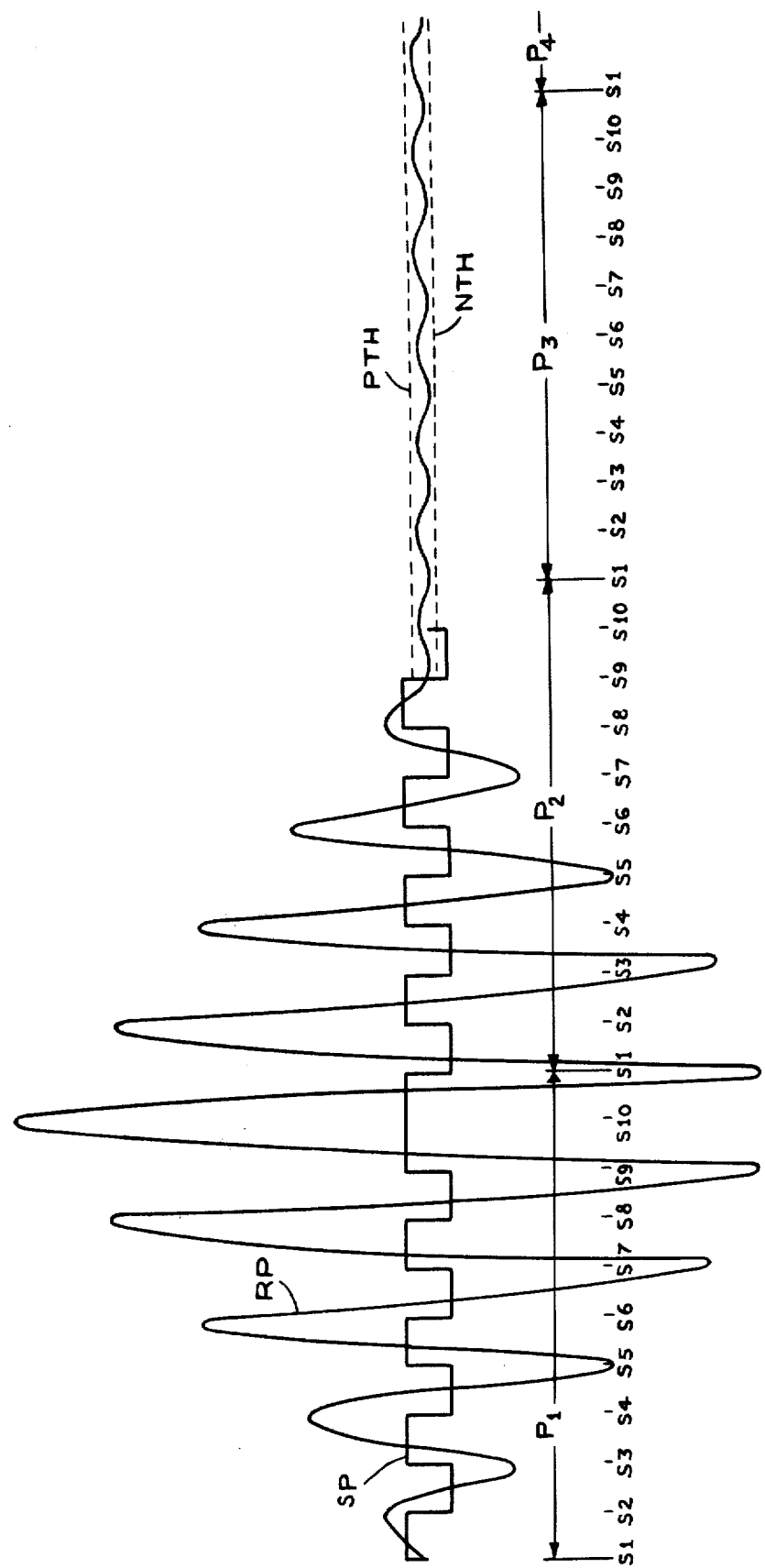
FIG. 3 shows waveforms useful in explaining the theory of the invention.

As was discussed above, if the second current yields a torque which is close to the desired torque then the oscillations will be very small following the end of phase two P2, which is the case shown in FIG. 3. If the selected current is outside of the range there will be large oscillations which will not considerably die down by the end of phase three P3. Thus it is by counting the oscillations that one arrives at the desired current.

However, it is possible to arrive at a desired current without running through the whole set of currents. In particular, one starts with the first current and keeps monitonically increasing the current for each set until a set shows a count below a predetermined minimum count during phase three. One immediately selects that current and proceeds to the positioning mode.

There will now be described apparatus for performing the above described calibration of the stepping motor system SMS.

Figure 4:
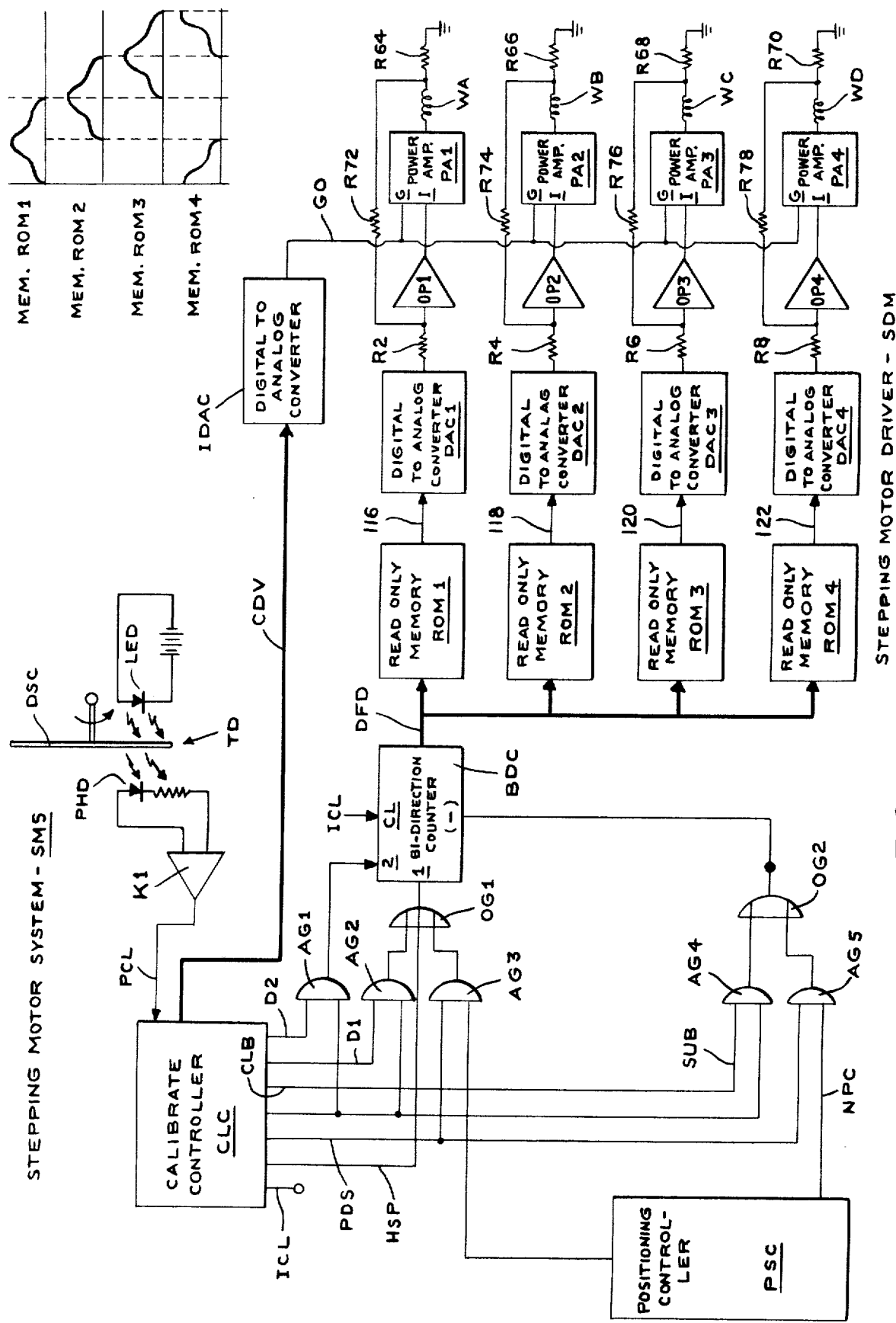
FIG. 4 is a detailed block diagram of the stepping motor system of the invention.

In FIG. 4 the system SMS is shown centered around the stepping motor drive SDM, the transducer TD, the calibrate controller CLC, the position controller PSC, the digital-to-analog converter IDAC, and a switching network which selectively connects the controllers to the stepping motor driver SDM.

The transducer TD is as described above and has an amplifier K1 which emits a pulse on line PCL to calibrate controller CLC whenever there is a transition between the transmission and non-transmission of light through the disc DSC.

The stepping motor driver SDM includes the bidirectional counter BDC acting as an address generator and having a clear input CL connected to line ICL, a unit increment input 1 and a two increment input 2 connected to the switching network, a signal changing input (−) connected to the switching network, and an address output cable DFP.

Cable DFP feeds signals or addrsses in parallel to read-only-memories ROM1, ROM2, ROM3, and ROM4. These in turn are connected via respective lines to digital-to-analog converters DAC1, DAC2, DAC3 and DAC4.

The digital-to-analog converters are connected via resistors R2, R4, R6 and R8 to op amps OA1, OA2, OA3 and OA4 in turn connected to the signal inputs I of power amplifiers PA1, PA2, PA3 and PA4 having gain control inputs G connected to line GO. The power amplifiers PA2, PA4, PA6 and PA8 are respectively connected to windings WA, WB, WC and WD which represent the four phases of a stepping motor. The number of phases is selected for illustrative purposes only and is in no way limiting of the invention.

Resistors R64, R66, R68 and R70 are sensing resistors connected between the aforesaid windings and ground and they operate in conjunction with resistors R72, R74, R76, and R80 connected in feedback relationship to the aforementioned op amplifiers OA1, OA2, OA3 and OA4.

In the memories ROM1, ROM2, ROM3 and ROM4 are pre-recorded the appropriate current profiles $I_A$, $I_B$, $I_C$, and $I_D$ (as functions of angle), the memory output data at any instant represent the instantaneous values of the winding currents. The current profiles are generated in the manner described in my above-referenced applications. The current profile of each memory is also shown in FIG. 4. In the case of memory ROM1, its output is converted into the analog voltage by the digital-to-analog converter DAC1. The output loop, which consists of the operational amplifier OA1, the power amplifier PA1, resistors R64, R72 and R2, drives current through the phase A motor winding WA. Since the voltage of the junction of resistors R64 and R72 is proportional to winding current, the distinct property of virtual ground of the op amp forces the motor current to be directly proportional to the digital-to-analog converter output. Thus the desired current waveforms control the position of the motor. While the shape of the waveforms remain constant the amplitude of the waveform is controlled by the signal on line GO from digital to analog converter IDAC.

The digital-to-analog converter IDAC having its inputs connected to cable CDV like the digital-to-analog converters DAC1 to DAC4 are conventional in that they convert the digital value presented at their inputs to an analog voltage.

The positioning controller PSC which controls desired motor movements is described more fully is the above-cited copending applications.

The calibrate controller CLC which is herinafter more fully described determines whether the system is in the calibrate mode as indicated by a signal on line CLB or in the positioning mode as indicated by a signal on line POS. The calibrate controller also includes: a current counter which is periodically incremented to give the present digital value of the current operative during each step of the calibrate mode; a current register which continuously stores the present "optimum" value of the current to be used during the positioning mode; a count accumulator for accumulating the number of oscillations exceeding a given amplitude during phase P3 of each step of the calibrate mode; a count register for storing the present minimum number of such excessive oscillation; and a comparater for comparing the values stored in the count register and count accumulator.

The operation of the apparatus shown in FIG. 4 will be described with the help of the waveforms of FIG. 3. In particular, when the motor system is to be used, a switch is thrown within the calibrate controller CLC to start the operation. This switch causes the generation of the signal on line ICL. Within the calibrate controller CLC the current counter is set to a predetermined minimum value as is the current register. In addition, the count register is set to a maximum value and the count accumulator is cleared to zero. Furthermore, the signal on line ICL is fed to the clear input of the bi-directional counter BDC to set it to a zero value. Thereafter, the calibrate controller CLC emits pulses on line HSP which periodically increment the counter BDC causing the stepping motor driver SDM to step the motor. This stepping continues until light is sensed through the slit in the disc DSC resulting in the amplifier K1 generating a signal on line PCL fed to the calibrate controller CLC. The pulses on line HSP now stop. The calibrate controller now emits a signal on line CLB indicative of the calibrate mode. The system is now in the first step of the calibrate mode with the minimum current representation on the cable CDV. During phase P1 of this mode, there is first a signal fed on line D1 causing the counter BDC to increment by one unit and the motor is rocked off the fudicial position. See Time S1 of phase P1 of FIG. 3 at Time S2 the calibrate controller simultaneously generates a signal I on line SUB and a signal on line D2. This causes the counter BDC to decrement by two values. See the Time S2 of phase P1 in FIG. 3. At Time S3 the signal is no longer present on line SUB and there is another pulse on line D2 causing the counter to increment by two values. This rocking motion continues until Time S10 of phase P1. At that time, instead of the count being switched, it remains in the same value for one time period, that is until the Time S1 of the phase P2. Now the two increment rocking motion continues until time S10 of the phase P2 when the count is incremented by a unit value, so that the counter is now at its initial value and phase P3 is entered. During phase P3, the calibrate controller CLC looks for oscillations which exceed the limits PTH and NTH of FIG. 3. The amplitude of these oscillations is sampled by means of controlling the width of the slot in the disc DSC. At the end of phase P3 of the first series, phase P4 is entered. During time S1 of phase P4 the value in the count register and the value in the count accumulator are compared in the calibrate controller. If the count in the count register is greater than the count in the count accumulator, then the count in the count accumulator is transferred to the count register and the count accumulator is again cleared to zero. At the same time the value in the current counter is transferred to the current register. If however, the count in the count accumulator were greater than the count in the count register, these transfers would not have occurred and only the count accumulator would have been cleared to zero. Then the current counter would be unit incremented so that the gain of the power amplifiers PA1 to PA4 can be increased for the next step of the calibration mode. The same phases P1 to P4 are repeated for the second series.

These series are repeated and for each series there is an increase of the gain to the amplifiers until a maximum gain is reached. During phase P4 associated with this maximum gain, the calibrate controller now terminates the signal on line CLB and initiates the signal on line POS. At the same time the calibrate controller CLC emits the digital value on line CDV associated with the gain which produced the minimum number of "over" oscillations.

In fact, the operation can be summarized by the following table.

| Initial Clear - initialize disc position counters and registers and start calibrate mode. | |
| --- | --- |
| Series 1 | |
| Time P1S1 | add 1 to counter BDC |
| Time P1S2 | subtract one from counter BDC |
| Time P1S3 | add two to counter BDC |
| Time P1S4 | subtract two from counter BDC |
| Time P1S5 | add two to counter BDC |
| Time P1S6 | subtract two from counter BDC |
| Time P1S7 | add two to counter BDC |
| Time P1S8 | subtract two from counter BDC |
| Time P1S9 | add two to counter BDC |
| Time P1S10 | do not change counter BDC |
| Time P2S1 | subtract two from counter BDC |
| Time P2S2 | add two to counter BDC |
| Time P2S3 | subtract two from counter |
| Time P2S4 | add two to counter BDC |
| Time P2S5 | subtract two from counter BDC |
| Time P2S6 | add two to counter BDC |
| Time P2S7 | subtract two from counter BDC |
| Time P2S8 | add two to counter BDC |
| Time P2S9 | subtract two from counter BDC |
| Time P2S10 | add one to counter BDC |
| Time P3S1 to Time P3S10 | count "over " oscillations |
| Time P4S1 | compare values in count register with value in accumulator |
| Time P4S2 | transfer value in current counter to current register and value in count accumulator to count register if required |
| Time P4S3 | clear count accumulator and comparator |
| Time P4S4 | clear count accumulator and comparator |
| Time P4S5 | increment current counter |
| ... | |
| Time P4S10 | |
| Series 2 to 9 same as Series 1 | |
| Series 10 | |
| ... | |
| ... | |
| P4S4 | terminate calibrate mode and initiate positioning mode. |

The details of the system of FIG. 4 will now be described. The switching network of the stepping motor system SMS centers around the OR-circuit OG1 and the OR-circuit OG2. The OR-circuit OG1 is connected to the incrementing input of the counter BDC and the OR-circuit OG2 is connected to the sign control of the counter. The AND-circuit AG2 having one input connected to the OR-circuit OG1 is activated during the calibrate mode by the signal on line CLB to permit unit incrementing of the counter by signals on line D1. The signal on line HSP fed to the OR-circuit OG1 permits stepping the counter while the motor is initially driven to the fudicial position. The AND-circuit AG3 which is connected to the third input of the OR-circuit OG1 is used during the positioning mode as indicated by a signal on line POS. The AND-circuit AG4 having inputs connected to line SUB and lines SUB and CLB control the counter to decrement during the calibrate mode. Similarly, the signal on line POS and the signal on NPC control decrementing of the counter during the positioning mode. Finally, the AND-circuit AG1 having inputs connected to lines D2 and CLB and an output connected to the two inputs of the counter BBC permits changing the count in the counter by a value of two.

Figure 5:
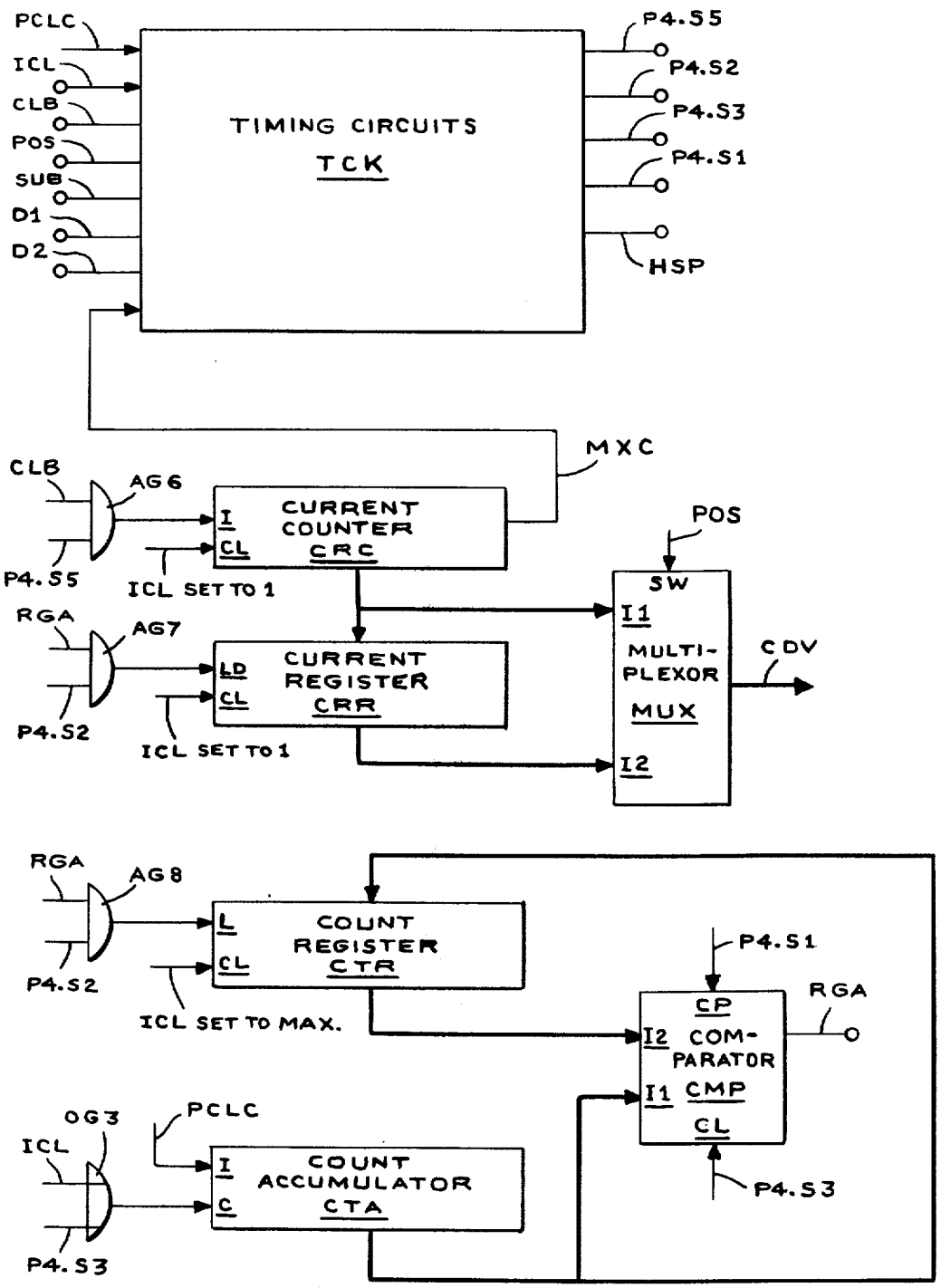
FIG. 5 shows a logic diagram of the calibrate controller of the system of FIG. 4.

In FIG. 5 there is shown the details of the calibrate controller. The calibrate controller CLC includes the timing circuits which generally control the basic switching during the operation of the system. In addition, the controller includes the current counter CRC and the current register CRR whose outputs feed inputs of the multiplexer MUX. Furthermore, the controller includes the count register CTR and the count accumulator CTA whose outputs are fed to inputs of the comparator CMP.

At the start of the operations, the signal on line ICL clears the current counter CRC to an initial value of one and also clears the current register CRR to this same initial value. The output of the current counter CRC is fed via cables to a parallel input of the current register CRR and one of the inputs I1 of the multiplexer MUX. While the output of the current register is fed to the other input of the multiplexer MUX. During the calibrate mode in the absence of the signal on line POS the multiplexer MUX connects its input I1 to the line CDV. During the positioning mode, the multiplexer in the presence of a signal on line POS connects its input I2 to the cable CDV. It should be noted that during the calibrate mode AND-circuit AG6 is activated so that during phase P4 of each series the current counter is incremented by one. AND-circuit AG7 which controls the loading input of the current register CRR is activated during step S2 of phase P4 so that if the count in the count register CTR is less than the count in the count accumulator CTA then the current register is loaded with the value of the current counter. At the start of the calibrate mode, the signal on line PCLC will unit increment the count accumulator CTA. In addition, the count accumulator CTA is cleared to zero at the occurrence of a signal on line ICL or a signal on line P4.S3 feeding OR-circuit OG3. The output of the count accumulator is fed via a cable to the input I1 of the comparator CMP and also to the input of the count register CTR. The count register CTR is initially cleared during the occurrence of a signal on line ICL. It is also loaded with the value in the count accumulator upon receipt of a signal from AND-circuit AG8 having inputs respectively connected to the lines RGA and the line P4.S2. The output of the count register CTR is fed to the second input I2 of the comparator CMP. The comparator CMP compares the values represented on the lines on the cables from the count register CTR and the count accumulator CTA. This comparison is timed to occur during the step S2 of the phase P4 as indicated by the signal on line P4.S2. If the value receives that input I2 is greater than the value received at input I1 there is then a signal present on the output connected to line RGA. Otherwise there is no signal present there. In any event the comparator is cleared thereafter by a signal present on line P4.S3.

Figure 6:
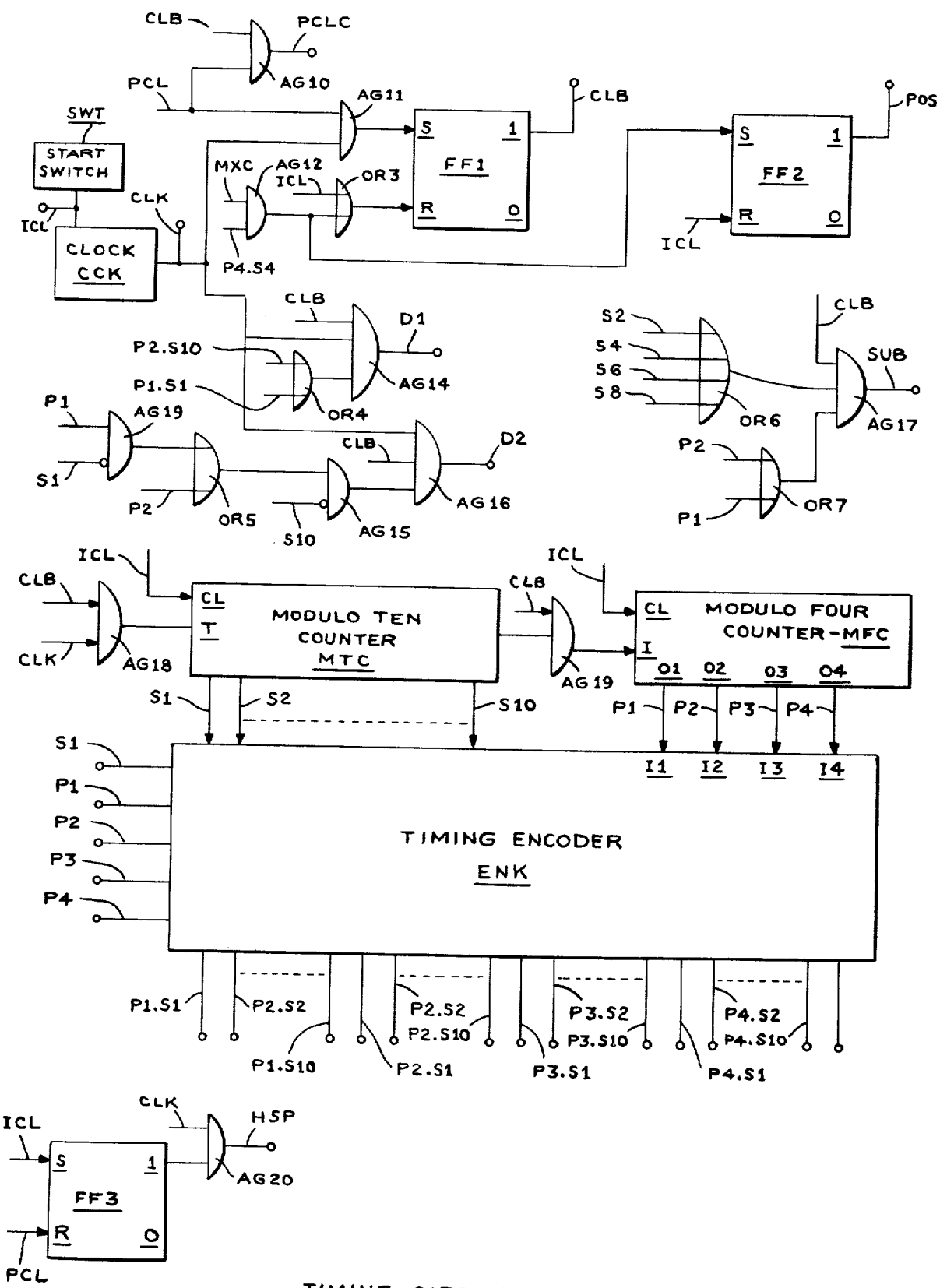
FIG. 6 shows a logic diagram of the timing circuits of the calibrate controller of FIG. 5.

In FIG. 6 the timing circuits TCK are shown. These circuits generate the timing and control signals for operating the system. The clock CCK is a free-running pulse generator having a frequency equal to the desired resonance frequency of the system and generating clock pulses on the line CLK. The clock is activated by closure of the start switch SWT which generates the signal on ICL starting the clock. The signal on ICL also sets the flip-flop FF3 which opens AND-circuits AG20 causing the clock pulses on line CLK to be transmitted to line HSP. It will recalled that these clock pulses now step the motor until it reaches the fudicial position causing the generation of a pulse on line PCL. This pulse gates a clock pulse on line CLK through AND-circuit AG10 causing the setting of flip-flop FF1. When flip-flop FF1 is set, it generates the signal on line CLB indicating the calibrate mode. The calibrate mode will last until the step S4 of the phase P4 of the last step as indicated by the signal MXC at the AND-circuit AG12 which passes a pulse by OR-circuit OR3 to clear the flip-flop FF1 ending the calibrate mode and setting the flip-flop FF2 starting the positioning mode as represented by the signal present on the line POS.

The timing pulses are generated by the assembly centered around modulo ten counter MTC, modulo four counter MFC and the timing coder ENK. The signal on line ICL initially clears both of these counters. Thereafter, during the calibrate mode the respective and circuits AG18 and AG19 are allowed. The clock pulses pass via AND-circuit AG18 to increment the modulo ten counter. Whenever the count in set counter passes through ten, it will increment the modulo four counter. The outputs S1 to S10 of the modulo ten counter and the outputs P1 to P4 of the modulo four counter are fed to the timing and coder ENK. The timing and coder ENK is merely a plurality of two input AND-circuits generating the respective signals; for example, the signal P1.S1 is generated by an AND-circuit having inputs respectively connected to line P1 and to line S1. It should be noted that the period between the two parts of the reference numeral can be considered as an AND function. The AND-circuit AG17 fed by the line CLB and the output of OR-circuit OR6 and OR-circuit OG7 generate the timing for the SUB signal.

The signals on line D1 are generated by the AND-circuit AG14 having inputs connected to the line CLK, line CLD and the output of OR-circuit 04. The inputs of OR-circuit OR4 are the lines P3.S10 and P1.S1. The signal on line D2 is generated by the AND-circuit AG16 having inputs connected to the lines CLK, CLD, and the output of AND-circuit AG15. The AND-circuit AG15 has an inhibiting input connected to line S10 and a direct input connected to the output of OR-circuit OR5 whose inputs are connected to the line P2 and the output of AND-circuit AG17. AND-circuit AG17 has its input connected to lines P1 and an inhibiting input connected to line S1.

An alternate and presently preferred embodiment of the invention uses the follow calibrate mode. In this mode the system undergoes a plurality of sets of three multistep phases. Each set is associated with a particular operating current for the stator windings. In each set there are three phases of operation and in each phase a plurality of steps. During phase one P'1 the controlled unit KLU emits a series of current impulses on the leads L1 to L4 to the stator windings. Each impulse is $2n+1$, where n is an integer, half resonant periods associated with the desired acceleration. During the second phase P'2 the control unit KLU senses for signals from the photo detector PHD to determine the number of oscillations occurring during this phase. During the third phase P'3, the control unit KLU runs the housekeeping operations of updating the new current values to be emitted to the stator winding as well as to store information about the number of counted oscillations.

More particularly, with reference to FIGS. 2 and 7, the operation is as follows: At the start of the operation a switch is depressed which causes the stepping motor to automatically step to the point where the slot in the disc DSC is in the line of sight between the lighter emitting diode LED and the photo diode PHD. Thus the shaft is positioned to a home or fiducial position, then phase P'1 begins. During phase one P'1, the positive impulses or in-phase excitations as shown on line SP' of FIG. 7 cause the motor to oscillate according to the envelope EP. By positive impulses or in-phase excitations it is meant that the current changes are so timed with respect to the oscillatory period that they reinforce the oscillations which consequently build a maximum at time $t_{10}$ of the first phase P'1. In particular the impulses change direction at an odd integral multiple of the resonant period of the motor. For example the time between $t_m$ and $t_{n+1}$ can be seven half resonant periods of the motor. Thus the excitation change occurs in the same direction as the oscillations.

At the end of phase one P'1 the second phase P'2 begins. This second phase counts the oscillations whose amplitude exceeds the threshold values PTH' and NTH'. In one alternative the count of this number of threshold values is stored. Then the amplitude of the current to be utilized by the stepping motor is increased during a housekeeping phase three P'3. Thereafter, the same series of impulses performed for the new operating current and the count of the oscillations is stored for that current if it is greater than the number of oscillations counted for the previous current. Now a third current is selected and the routine is repeated. In fact, the routine is repeated for a plurality of, for example, ten currents. At the end of the routine there will be stored, the current associated with the maximum oscillation count of the second phases P'2. Thereafter, the system reverts to the positioning mode using the current associated with the minimum count.

Figure 7:
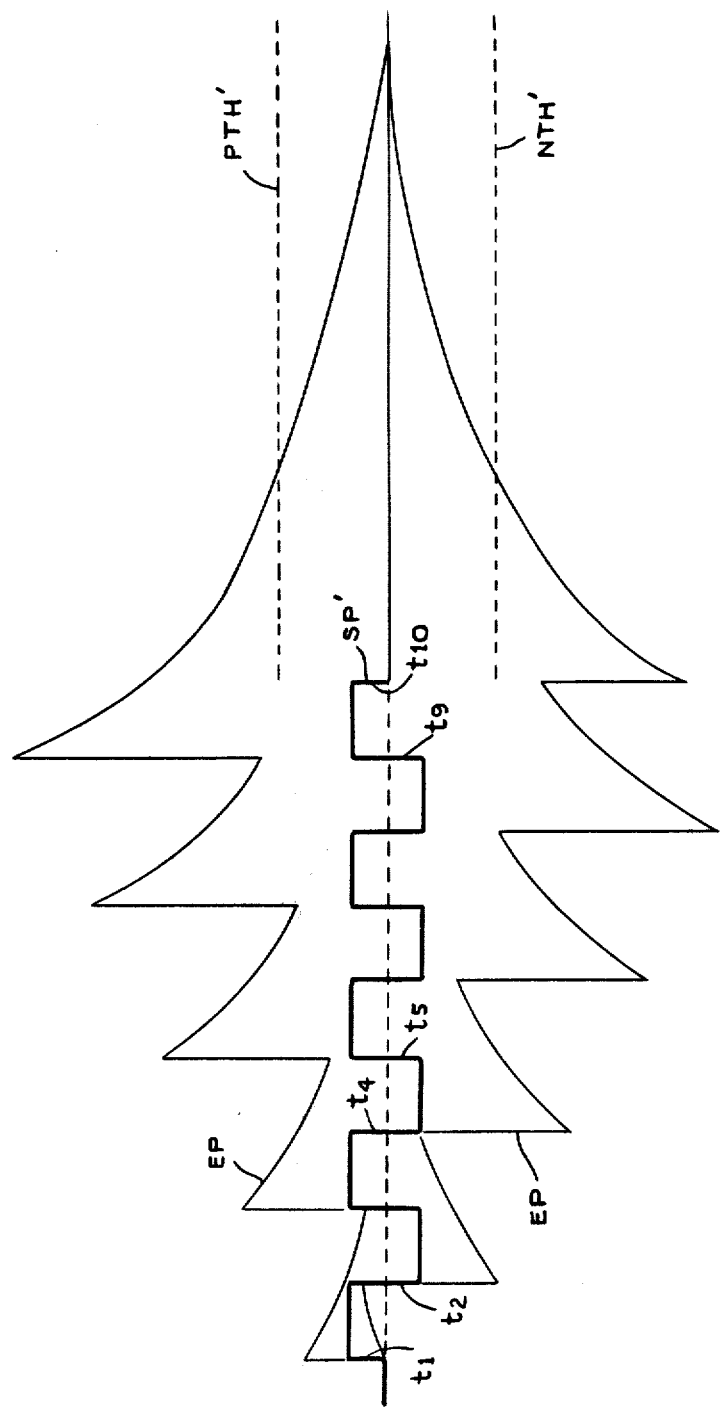
FIG. 7 shows waveform useful in explaining the preferred embodiment of the invention.

If the second current yields a torque which is close to the desired torque then the oscillations will be very large following the end of phase one P'1, which is the case shown in FIG. 7. If the selected current is outside of the range there will be small oscillations. Thus it is by counting the oscillations that one arrives at the desired current.

However, it is possible just as above to arrive at a desired current without running through the whole set of currents. In particular, one starts with the first current and keeps monotonically increasing the current for each set until a set shows a count greater than a predetermined maximum count during phase two P'2. One immediately selects that current and proceeds to the positioning mode.

The apparatus performing this embodiment is very similar to that shown in FIG. 4. Therefore, only modifications of that apparatus will be discussed.

In fact, for the present example the modifications concern primarily the timing circuits of FIG. 6. In particular the period of the clock CCK is increased seven fold. Connect output 01 of counter MFC to input I1 of encoder ENK. Connect output 02 of counter MFC to the input I3 of encoder ENK, connect output 03 of counter MFC to input I4 of encoder ENK. Maintain the input I2 of encoder ENK to a zero logic level. Replace lead PS.S10 into OR-circuit OR4 by lead P1.S110. Add lead S10 as an input into OR-circuit OR6.

There has just been shown an improved method for calibrating a stepping motor to determine that current which is optimum for the acceleration in spite of the fact that the moment of inertia or the torque on the motor could change.

In addition to determining the optimum currents for the motor, such procedures could be used for fault analysis and fine tuning of stepping motors.

While only a limited number of embodiments of the invention has been shown and described in detail there will now be obvious to those skilled in the art, many modifications and variations satisfying many or all of the objects of the invention which do not depart from the spirit thereof as defined by the appended claims. For example, while it is preferable to count the number of oscillations which exceed a given amplitude after excitation, one could measure either the amplitude or the instantaneous velocity of an oscillation to obtain the same result. Furthermore, where the output of digital to analog converted IDAC controlled the gain of the power amplifiers PAN one could equally use multiplying digital to analog converters for the converters DACN and feed the output from controller CLC directly thereto. Finally, while the system has been shown using discrete logic units it is possible to replace a considerable portion of the hardware with a currently available microprocessor.

What is claimed is:

1. For a stepping motor having a rotor which is driven to rotate in response to currents having given waveforms in the stator windings, the method of determining an an operating parameter of the motor comprising the steps of: periodically imparting a series of current impulses of alternating polarity to the stator windings so that the rotor can oscillate about a give rest position with the amplitude of the oscillations increasing, each of said current pulses having a duration that is an integer multiple of the resonant period of the motor; monitoring the resulting oscillations; and indicating the operating parameter of the motor in accordance with the amplitude of at least one of said resulting oscillations.

2. The method of claim 1 wherein the indicating results from the number of resulting oscillations in a particular amplitude range during a given period of time.

3. For a stepping motor having a rotor which is driven to rotate in response to currents having given waveforms in the stator windings, the method of determining an optimum amplitude of the currents applied to the stator windings comprising: for each of a plurality of different current amplitudes periodically imparting a series of current impulses of alternating polarity related to a specific portion of the given waveforms to the stator windings so that the rotor can oscillate about a given rest position with the amplitude of the oscillations increasing, the period of a current impulse being a plurality of resonant periods of the stepping motor, then counting the number of oscillations exceeding a given amplitude during a given period of time; and indicating the current applitude which results in the maximum number of oscillations during the given period of time.

4. The method of claim 3 further comprising the step of initially rotating the rotor until it reaches the rest position.

5. For a stepping motor having a rotor which is driven to rotate in response to currents having given waveforms in the stator windings, the method of determining an optimum amplitude of the currents applied to the stator windings comprising: for each of a plurality of different current amplitudes periodically imparting a first series current impulses of alternating polarity related to a specific portion of the given waveforms to the stator windings so that the rotor can oscillate about a given rest position with the amplitude of the oscillations increasing, imparting a second and inverse series of current impulses of alternating polarity related to the specific portion of the given waveforms to the stator windings so that the rotor can oscillate about the rest position with the amplitude of the oscillations decreasing; then counting the number of oscillations exceeding a given amplitude during a given period of time; and indicating the current appllitude which results in the minimum number of oscillations during the given period of time.

6. For a stepping motor having a rotor which is driven to rotate in response to the stator field established by currents having given waveforms in the stator windings, the method of determining an optimum amplitude for the currents applied to the stator windings when rotationally positioning the rotor comprising the steps of: rotating the rotor to a predetermined home position; performing a plurality of excitation routines, each of said excitation routines including establishing a different given current amplitude for the given waveforms, imparting a series of current impulses to the stator windings, said first series comprising first and second interleaved sets of current impulses, each of the current impulses in the first set establishing a stator field position displaced in one direction by a given angle from the predetermined home position, each of the current impulses in the second set establishing a stator field position displaced in the opposite direction by said given angle from the predetermined home, whereby the rotor can oscillate about the predetermined home position with the amplitude of the oscillations increasing, and counting the number of oscillations exceeding a given amplitude during a given period of time for each impulse step; and indicating the current amplitude associated the impulse routine which results in the maximum number of oscillations during the given period of time.

7. The method of claim 6 further comprising performing an excitation routine for each current amplitude of a set of current amplitudes.

8. The method of claim 6 comprising generating a monotonically changing set of current amplitudes, performing an excitation routine for of the current amplitudes in order and indicating the first current amplitude in the set which results in less than a given number of oscillations exceeding said given amplitude during the period of time.

9. The method of claims 7 or 8 further comprising the step of thereafter utilizing the indicated current amplitude when positioning the motor in response to subsequent positioning commands.

10. For a stepping motor having a rotor which is driven to rotate in response to the stator field established by currents having given waveform in the stator windings, the method of determining an optimum amplitude for the currents applied to the stator windings when rotationally positioning the rotor comprising the steps of: rotating the rotor to a predetermined home position; performing a plurality of excitation routines, each of said excitation routines including establishing a different given current amplitude for the given waveforms, imparting a first series of current impulses to the stator windings, said first series comprising first and second interleaved sets of current impulses, each of the current impulses in the first set establishing a stator field position displaced in one direction by a given angle from the predetermined home position, each of the current impulses in the second set establishing a stator field position displaced in the opposite direction by said given angle from the predetermined home, whereby the rotor can oscillate about the predetermined home position with the amplitude of the oscillations increasing, imparting a second series of current impulses to the stator windings said second series comprising said first and second sets interleaved in the alternate order whereby the rotor can oscillate about the predetermined home position with the amplitude of the oscillations decreasing, and counting the number of oscillations exceeding a given amplitude during a given period of time for each impulse step; and indicating the current amplitude associated the impulse routine which results in the minimum number of oscillations during the given period of time.

* * * * *